(12) United States Patent
Oliver et al.

(10) Patent No.: US 10,348,281 B1
(45) Date of Patent: Jul. 9, 2019

(54) CLOCK CONTROL BASED ON VOLTAGE ASSOCIATED WITH A MICROPROCESSOR

(71) Applicant: Ampere Computing LLC, Santa Clara, CA (US)

(72) Inventors: David S. Oliver, Providence, UT (US); Matthew W. Ashcraft, Belmont, CA (US); Luca Ravezzi, San Francisco, CA (US); Alfred Yeung, Fremont, CA (US); John Gregory Favor, Scotts Valley, CA (US)

(73) Assignee: AMPERE COMPUTING LLC, Santa Clara, CA (US)

( * ) Notice: Subject to any disclaimer, the term of this patent is extended or adjusted under 35 U.S.C. 154(b) by 154 days.

(21) Appl. No.: 15/256,787

(22) Filed: Sep. 6, 2016

(51) Int. Cl.
  *G06F 1/00* (2006.01)
  *H03K 5/1252* (2006.01)
  *H03L 7/00* (2006.01)

(52) U.S. Cl.
  CPC ............. *H03K 5/1252* (2013.01); *H03L 7/00* (2013.01)

(58) Field of Classification Search
  CPC ........... G06F 1/32; G06F 1/08; H03K 3/0315; H03K 19/0016
  See application file for complete search history.

(56) References Cited

U.S. PATENT DOCUMENTS

| | | |
|---|---|---|
| 6,532,574 B1 | 3/2003 | Durham et al. |
| 6,876,239 B2 | 4/2005 | Bell |
| 6,922,111 B2 | 7/2005 | Kurd et al. |
| 7,225,349 B2 | 5/2007 | Tam et al. |
| 7,409,569 B2 | 8/2008 | Tam et al. |
| 7,772,889 B2 | 8/2010 | Naffziger et al. |
| 7,937,563 B2 | 5/2011 | Naffziger et al. |
| 8,060,766 B2 | 11/2011 | Konstadinidis et al. |
| 8,497,694 B2 | 7/2013 | Chua-Eoan et al. |
| 8,510,582 B2 | 8/2013 | Naffziger et al. |
| 8,587,357 B2 | 11/2013 | Kim et al. |
| 8,862,909 B2 | 10/2014 | Branover et al. |
| 8,924,758 B2 | 12/2014 | Steinman et al. |
| 8,949,666 B2 | 2/2015 | Reddi et al. |
| 9,298,250 B2 | 3/2016 | Drake et al. |
| 2004/0119521 A1 | 6/2004 | Kurd et al. |
| 2011/0291630 A1 | 12/2011 | Konstadinidis et al. |

(Continued)

OTHER PUBLICATIONS

WIPO Application No. PCT/US2017/045825, International Search Report and Written Opinion of the International Searching Authority, dated Nov. 17, 2017.

*Primary Examiner* — Xuxing Chen
(74) *Attorney, Agent, or Firm* — Alston & Bird LLP

(57) ABSTRACT

Various aspects provide for mitigating voltage droop associated with a microprocessor (e.g., by controlling a clock associated with the microprocessor). For example, a system can include a microprocessor and a controller. The microprocessor can receive a clock provided by a clock buffer. The controller can control frequency of the clock provided by the clock buffer based on a voltage associated with the microprocessor. In an aspect, the controller can reduce the frequency of the clock in response to a determination that the voltage satisfies a defined criterion. Additionally, the controller can incrementally increase the frequency of the clock in response to another determination that the voltage satisfies another defined criterion after satisfying the defined criterion.

15 Claims, 12 Drawing Sheets

(56) References Cited

U.S. PATENT DOCUMENTS

| | | |
|---|---|---|
| 2012/0133352 A1* | 5/2012 | Frank .................... G06F 1/324 |
| | | 713/340 |
| 2012/0187991 A1 | 7/2012 | Sathe et al. |
| 2014/0009977 A1* | 1/2014 | Huang .............. H02M 3/33507 |
| | | 363/21.16 |
| 2014/0254734 A1 | 9/2014 | Abdelmoneum et al. |
| 2016/0033576 A1 | 2/2016 | Turullols et al. |
| 2016/0072491 A1 | 3/2016 | Bowman et al. |
| 2017/0005665 A1* | 1/2017 | Swaminathan ......... H03L 7/099 |

* cited by examiner

CLOCK CONTROL BASED ON VOLTAGE ASSOCIATED WITH A MICROPROCESSOR

TECHNICAL FIELD

The subject disclosure relates generally to a microprocessor system, and more particularly to controlling a clock based on voltage associated with a microprocessor.

BACKGROUND

Voltage supply to a microprocessor must be kept within a certain operating range to prevent failure and/or decreased performance of the microprocessor. However, a sudden change in circuit switching activity (e.g., transitioning out of an idle state upon receiving an interrupt command, etc.) is common in a microprocessor. This rapid change in electrical current often results in noise for a voltage level provided to transistors of the microprocessor. Conventionally, a certain margin in the voltage level for the microprocessor is maintained during such events. In one example, the microprocessor can be operated at a higher voltage to compensate for such events. However, operating a microprocessor at a higher voltage often reduces performance of the microprocessor.

The above-described description is merely intended to provide a contextual overview of current microprocessor systems and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In an example embodiment, a system comprises a microprocessor and a controller. The microprocessor is configured to receive a clock provided by a clock buffer. The controller is configured for controlling a frequency of the clock provided by the clock buffer based on a voltage associated with the microprocessor. In an aspect, the controller is configured for reducing the frequency of the clock in response to a determination that the voltage is below a defined threshold. In another aspect, the controller is configured for incrementally increasing the frequency of the clock in response to another determination that the voltage is equal to or above the defined threshold after being below the defined threshold.

In another example embodiment, a system comprises a voltage detector circuit and a controller. The voltage detector circuit is configured to monitor a voltage associated with a microprocessor. The controller is configured for reducing a frequency of a clock associated with the microprocessor in response to a determination that the voltage satisfies a defined criterion, and incrementally increasing the frequency of the clock in response to another determination that the voltage satisfies another defined criterion after satisfying the defined criterion.

In yet another example embodiment, a method comprises monitoring a voltage associated with a microprocessor, reducing a frequency of a clock provided to the microprocessor in response to a detection of a voltage droop event, and incrementally increasing the frequency of the clock in response to another determination that the voltage droop event has ended.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
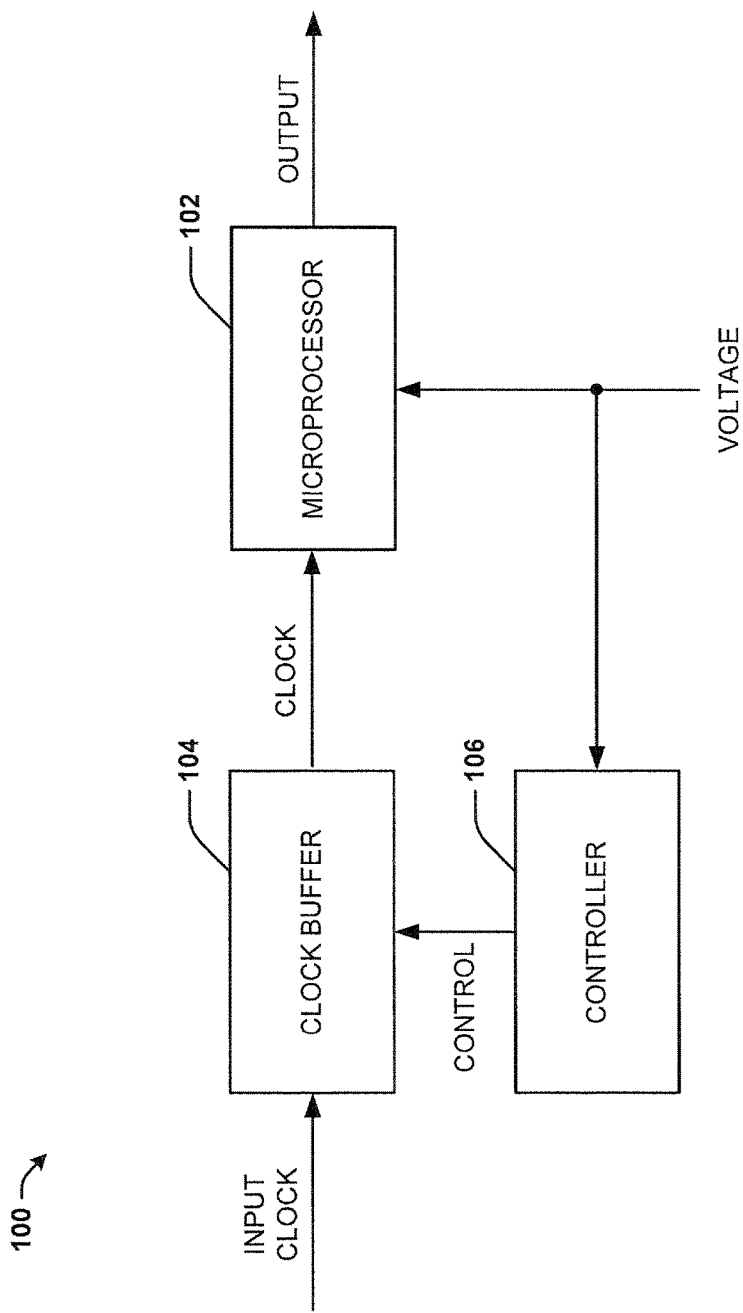
FIG. 1 is a block diagram illustrating an example, non-limiting embodiment of a microprocessor system in accordance with various aspects described herein.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

Various aspects of the present disclosure provide for mitigating voltage droop associated with a microprocessor (e.g., by controlling a clock associated with the microprocessor). For example, a voltage droop event associated with a microprocessor can be detected by a voltage detector circuit. In response to detection of a voltage droop event by the voltage detector circuit, a clock provided to the microprocessor can be switched to a defined clock frequency that is slower than a normal frequency (e.g., a current frequency) of the clock. Once the voltage droop event ends (e.g., a voltage provided to the microprocessor returns to a voltage level that was provided to the microprocessor before the voltage droop event), the defined clock frequency of the clock can be incrementally increased until the clock frequency of the clock returns to the normal frequency of the clock before the voltage droop event. In an aspect, a controller can reduce frequency of the clock provided to the microprocessor when the voltage droop event occurs. Furthermore, the controller can incrementally increase the frequency of the clock once the voltage droop event has ended (e.g., once voltage provided to the microprocessor returns to a normal voltage level). Therefore, mitigation of voltage droop associated with a microprocessor can be achieved and/or tolerance to voltage supply noise in a microprocessor system can be improved. Accordingly, a voltage margin required to avoid a microprocessor failure can be improved. Moreover, operating voltage of a microprocessor can be lowered (e.g., to save energy) and/or operating frequency of a microprocessor can be increased (e.g., to improve performance of the microprocessor).

Turning now to FIG. 1, a block diagram illustrating an example, non-limiting embodiment of a system 100 in accordance with various aspects described herein is shown. The system 100 can be a microprocessor system that includes a microprocessor 102. In one example, the system 100 can be associated with a system on a chip (SoC). The microprocessor 102 can receive a clock (e.g., CLOCK shown in FIG. 1) associated with (e.g., provided by) a clock buffer 104. For example, the clock provided to the microprocessor 102 can be driven by the clock buffer 104. The clock buffer 104 can be, for example, a microprocessor clock buffer. In an aspect, the clock buffer 104 can select the clock (e.g., the clock provided to the microprocessor 102) from a set of clocks (e.g., a set of predefined clock values). The microprocessor 102 can, for example, generate output (e.g., OUTPUT shown in FIG. 1) based at least on the clock (e.g., CLOCK) provided to the microprocessor 102.

System 100 also includes a controller 106. The controller 106 can be employed to facilitate mitigation of voltage droop in the system 100. For example, the controller 106 can include voltage droop mitigation logic configured to detect and/or respond to voltage droop in the system 100. The controller 106 can control the clock buffer 104 based on a voltage (e.g., VOLTAGE shown in FIG. 1) associated with the microprocessor 102. For example, the controller 106 can provide a control signal (e.g., CONTROL shown in FIG. 1) to the clock buffer 104. The control signal provided to the clock buffer 104 can be configured (e.g., by the controller 106) based at least in part on the voltage (e.g., the voltage associated with the microprocessor 102). Therefore, the controller 106 can control the clock buffer 104 (e.g., frequency of the clock provided by the clock buffer 104) in response to a detection of a voltage droop associated with the voltage (e.g., the voltage associated with the microprocessor 102). In one example, the voltage (e.g., the voltage associated with the microprocessor 102) can be a supply voltage (e.g., power supply voltage, integrated circuit supply voltage, etc.) received by the microprocessor 102. Additionally or alternatively, the controller 106 can control the clock buffer 104 based on a level of noise associated with the voltage (e.g., the voltage associated with the microprocessor 102). For example, a circuit (not shown) in communication with the controller 106 can be configured to detect a level of noise associated with the voltage via one or more noise detection techniques. Therefore, the controller 106 can detect voltage noise (e.g., voltage supply noise) in the system 100.

In an embodiment, the clock buffer 104 can receive an input clock (e.g., INPUT CLOCK shown in FIG. 1). The clock buffer 104 can transform the input clock into the clock (e.g., the clock received by the microprocessor 102) based on a the control signal generated by the controller 106. For example, the clock buffer 104 can transform the input clock into the clock (e.g., the clock received by the microprocessor 102) based on information provided by the controller 106 in response to the voltage. The controller 106 can modify a frequency of the input clock and/or the clock provided by the clock buffer 104 based on synchronous clock division. In an aspect, the controller 106 can reduce a frequency of the input clock (e.g., the clock provided by the clock buffer 104 can be lower than the input clock) and/or reduce a frequency of the clock provided by the clock buffer 104 in response to a determination that the voltage (e.g., the voltage associated with the microprocessor) satisfies a defined detection criterion. The controller 106 can reduce a frequency of the input clock and/or can provide the clock at a lower frequency in response to a determination that the voltage (e.g., the voltage associated with the microprocessor) is below a defined threshold. A frequency of a clock (e.g., a frequency of the input clock) can correspond to a speed of the clock. The defined threshold can be a voltage threshold value associated with a certain voltage amplitude (e.g., a voltage amplitude associated with noise). Therefore, when the voltage is below the defined threshold, the controller 106 can control the clock buffer 104 so that the clock provided by the clock buffer 104 is switched to a slower clock frequency (e.g., the controller 106 can temporarily slow the clock provided by the clock buffer 104 in response to a determination that the voltage is below the defined threshold). Furthermore, a voltage value below the defined threshold can be associated with a voltage droop event. A voltage droop event can be associated with a certain amount (e.g., an unwanted amount) of voltage noise. Therefore, the controller 106 can reduce a frequency of the clock (e.g., the clock provided by the clock buffer 104) in response to a voltage droop event. In another implementation, the controller 106 can reduce a frequency of the input clock and/or reduce a frequency of the clock provided by the clock buffer 104 in response to a determination that the voltage (e.g., the voltage associated with the microprocessor) satisfies a defined criterion (e.g., a defined threshold) associated with a time-averaged version of the voltage. In yet another implementation, the controller 106 can reduce a frequency of the input clock and/or reduce a frequency of the clock provided by the clock buffer 104 in response to a determination that the voltage (e.g., the voltage associated with the microprocessor) satisfies a defined criterion (e.g., a defined threshold) associated with a filtered reference voltage. In yet another implementation, the controller 106 can reduce a frequency of the input clock and/or reduce a frequency of the clock provided by the clock buffer 104 in response to a determination that voltage droop slope associated with the voltage (e.g., the voltage associated with the microprocessor) satisfies a defined criterion. Therefore, the controller 106 can be configured to reduce a frequency of the input clock and/or reduce a frequency of the clock provided by the clock buffer 104 in response to a fast voltage droop event or a slow voltage droop event. In another aspect, in addition to reducing the frequency of the input clock and/or a frequency of the clock provided by the clock buffer 104, the controller 106 can modify a high clock phase of the input clock and/or the clock provided by the clock buffer 104 in response to the determination that the voltage satisfies the defined detection criterion. Furthermore, the controller 106 can modify a low clock phase of the input clock and/or the clock provided by the clock buffer 104 in response to the determination that the voltage satisfies the defined detection criterion. As such, the controller 106 can increase a high clock phase and a low clock phase of the input clock and/or the clock provided by the clock buffer 104.

The controller 106 can reduce the frequency of the input clock and/or the clock provided by the clock buffer 104 to a defined frequency value (e.g., a first frequency) in response to the determination that the voltage (e.g., the voltage associated with the microprocessor) is below the defined threshold. In one example, the controller 106 can reduce the frequency of the input clock and/or the clock provided by the clock buffer 104 by dividing the frequency of the input clock (e.g., the controller 106 can reduce the frequency of the input clock by dividing the frequency of the clock in half, etc.). For example, the controller 106 can include clock divider logic that can be configured to divide the frequency of the input clock (e.g., reduce the speed of the input clock). In another example, the controller 106 can generate the control signal (e.g., CONTROL) for the clock buffer 104 in response to the determination that the voltage is below the defined threshold. In yet another example, the controller 106 can control the clock buffer 104 to select between a first clock value associated with a first clock frequency (e.g., a full frequency clock) and second clock value associated with a second clock frequency (e.g., a slower clock). The first clock frequency can correspond to a frequency value of the clock before being reduced (e.g., before the voltage droop event). The second clock frequency can correspond to a reduced frequency value after the determination that the voltage (e.g., the voltage associated with the microprocessor) is below the defined threshold. In an implementation, the controller 106 can incrementally reduce the frequency of the input clock and/or the clock provided by the clock buffer 104 to the defined frequency value (e.g., the first frequency) in response to the determination that the voltage (e.g., the voltage associated with the microprocessor) is below the defined threshold.

Additionally, the controller 106 can incrementally increase the frequency of the input clock and/or the clock provided by the clock buffer 104 in response to another determination that the voltage is equal to or above the defined threshold after being below the defined threshold. For example, in response to the other determination that the voltage is equal to or above the defined threshold after being below the defined threshold, the controller 106 can incrementally increase the frequency of the input clock and/or the clock provided by the clock buffer 104 until the frequency reaches a defined frequency level. The defined frequency level can correspond to the frequency of the input clock and/or the clock provided by the clock buffer 104 before being reduced (e.g., before the voltage droop event). For example, the controller 106 can repeatedly incrementally increase frequency of the clock, until an original frequency of the clock is reached, in response to the voltage being equal to or above the defined threshold after being below the defined threshold. In one example, a voltage value equal to or above the defined threshold can be associated with a normal voltage level (e.g., a voltage level that is not associated with a voltage droop event). The defined frequency level can be, for example, a normal frequency where the clock of the clock buffer 104 was operating before the voltage droop event.

It is to be appreciated that the controller 106 can alternatively reduce a frequency of the input clock and/or the clock provided by the clock buffer 104 in response to a determination that the voltage (e.g., the voltage associated with the microprocessor) is above a defined threshold. Therefore, the controller 106 can alternatively incrementally increase the frequency of the input clock and/or the clock provided by the clock buffer 104 in response to another determination that the voltage is equal to or below the defined threshold after being above the defined threshold.

In one example, the controller 106 can incrementally increase the frequency of the input clock and/or the clock provided by the clock buffer 104 based on a timer. By incrementally increasing the frequency of the input clock and/or the clock provided by the clock buffer 104, possibility of repeated voltage droop associated with the voltage can be reduced. In an aspect, the controller 106 can include a counter to monitor frequency and/or average length of voltage droop events associated with the voltage provided to the microprocessor. For example, the controller 106 can increment the counter in response to the determination that the voltage is below the defined threshold. Furthermore, the controller can determine an amount of time that the voltage is below the defined threshold before returning to a voltage value that is equal to or above the defined threshold.

In an implementation, the controller 106 can reduce the frequency of the clock provided by the clock buffer 104 to a first frequency that is less than the frequency of the clock in response to the determination that the voltage is below the defined threshold. Furthermore, the controller 106 can increase the first frequency of the clock provided by the clock buffer 104 to a second frequency that is greater than the first frequency in response to the other determination that the voltage is equal to or above the defined threshold after being below the defined threshold. Then, the controller 106 can increase the second frequency of the clock to a third frequency that is greater than the second frequency in response to the other determination that the voltage is equal to or above the defined threshold after being below the defined threshold. In one example, the controller 106 can increase the second frequency of the clock to the third frequency that is greater than the second frequency after a defined period of time. For example, a timer can set the defined period of time. It is to be appreciated that the controller can also increase the third frequency to a fourth frequency, etc. until the frequency of the clock before the voltage droop is reached.

In a non-limiting example, a frequency of a clock provided to the microprocessor 102 before a voltage droop event (e.g., a normal frequency of the clock) can be equal to S. In response to a determination that voltage provided to the microprocessor 102 is below a defined voltage threshold, the controller 106 can reduce the frequency of the clock to a clock frequency equal to S/2. However, it is to be appreciated that a frequency of the clock (e.g., a speed of the clock) can be reduced to a different value. Then, in response to another determination that the voltage has increased to be equal to or above the defined voltage threshold, the controller 106 can incrementally increase the clock frequency until the clock frequency is equal to S again. For example, the controller 106 can initially increase the clock frequency to 5S/8. Then, the controller 106 can increase the clock frequency to 6S/8, then to 7S/8, and finally to S. However, it is to be appreciated that a frequency of the clock (e.g., a speed of the clock) can be incrementally increase by a different amount. In one example, a frequency of the clock (e.g., a speed of the clock) can be incrementally increased by an equal amount. In another example, a frequency of the clock (e.g., a speed of the clock) can be incrementally increased by an unequal amount.

Accordingly, the system 100 can provide improved tolerance to voltage noise (e.g., voltage supply noise) associated with a microprocessor (e.g., the microprocessor 102). Also, with the system 100, a voltage margin (e.g., a frequency/voltage guard band) required to avoid microprocessor failure (e.g., failure of the microprocessor 102, a setup time violation associated with the microprocessor 102, an electrical circuit fault associated with the microprocessor 102, etc.) can be improved. Moreover, with the system 100, operating voltage of a microprocessor (e.g., the microprocessor 102) can be lowered (e.g., to save energy) and/or operating frequency of a microprocessor (e.g., the microprocessor 102) can be increased (e.g., to improve performance of the microprocessor).

Figure 2:
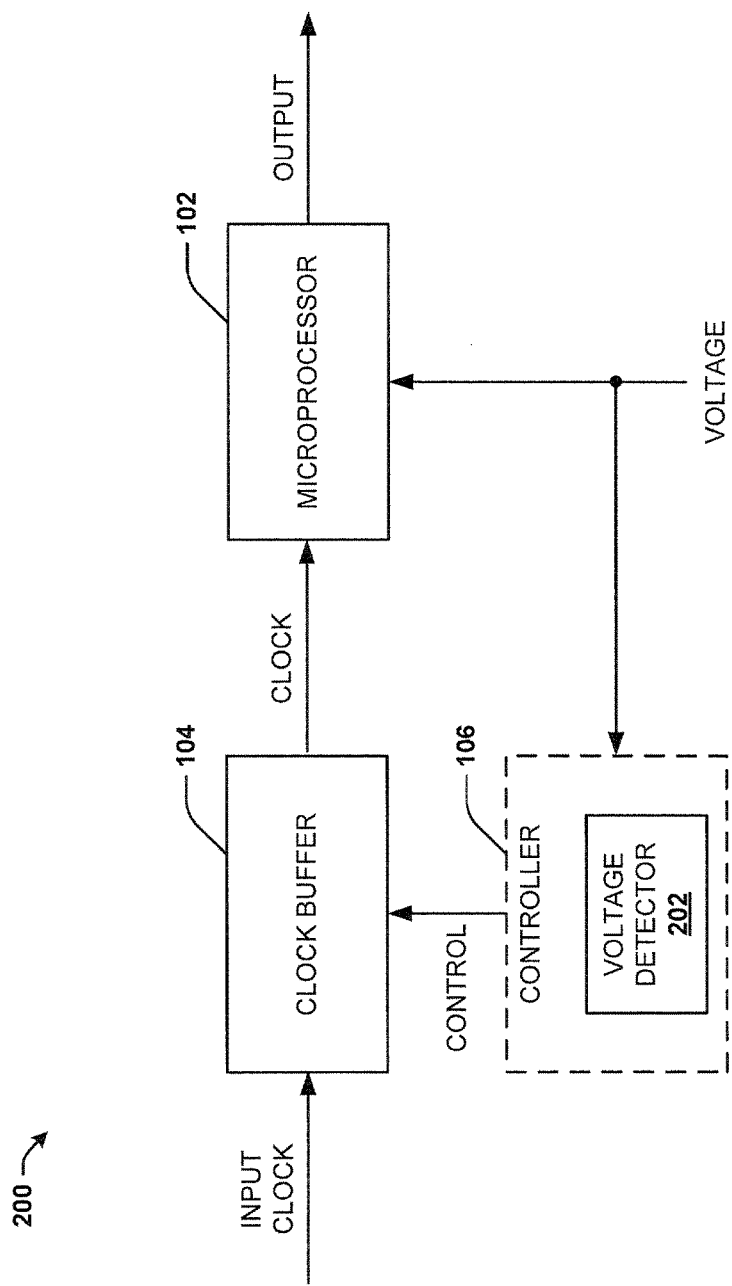
FIG. 2 is a block diagram illustrating an example, non-limiting embodiment of a controller included in a microprocessor system in accordance with various aspects described herein.

Referring now to FIG. 2, a block diagram illustrating an example, non-limiting embodiment of a system 200 in accordance with various aspects described herein is shown. System 200 includes the microprocessor 102, the clock buffer 104 and the controller 106. The controller 106 includes voltage detector 202. In another implementation, the voltage detector 202 can be separate from the controller 106 and/or in communication with the controller 106.

The voltage detector 202 can be a voltage detector circuit. In one example, the voltage detector 202 can be a hardware voltage detector circuit (e.g., an analog voltage detector circuit). In another example, the voltage detector 202 can include software functionality for detecting voltage. In yet another example, the voltage detector 202 can be a combination of hardware voltage detector circuitry and software functionality for detecting voltage. In an implementation, the voltage detector 202 can be associated with a set of voltage detector circuits (e.g., a set of analog voltage detector circuits). For example, the voltage detector 202 can be associated with a first voltage detector circuit (e.g., a first droop detector circuit) and a second voltage detector circuit (e.g., a second droop detector circuit). The first voltage detector circuit can be connected to a communication line associated with the voltage received by the microprocessor 102. Furthermore, the first voltage detector circuit can measure noise associated with the voltage received by the microprocessor 102. The second voltage detector circuit can receive a reference voltage that is different than the voltage received by the microprocessor 102. Furthermore, the second voltage detector circuit can provide an indication of a voltage droop (e.g., an absolute voltage droop) associated with the voltage received by the microprocessor 102.

The voltage detector 202 can monitor (e.g., continuously monitor) the voltage associated with (e.g., provided to) the microprocessor 102. In one example, the voltage detector 202 can monitor a communication line associated with the voltage received by the microprocessor 102. Therefore, the controller 106 can reduce a frequency of the clock (e.g., a speed of the clock) provided to the microprocessor 102 in response to a determination that the voltage monitored by the voltage detector 202 is below a defined threshold. Furthermore, the controller 106 can incrementally increasing the frequency of the clock (e.g., the speed of the clock) provided to the microprocessor 102 in response to another determination that the voltage monitored by the voltage detector 202 is equal to or above the defined threshold after being below the defined threshold.

In an aspect, in response to the other determination that the voltage monitored by the voltage detector 202 is equal to or above the defined threshold after being below the defined threshold, the controller 106 can incrementally increasing the frequency of the clock (e.g., the speed of the clock) provided to the microprocessor 102 until the frequency reaches a previously set frequency of the clock (e.g., a previously set speed for the clock) before being reduced. In another aspect, in response to the determination that the voltage monitored by the voltage detector 202 is below the defined threshold, the controller 106 can reduce the frequency of the clock (e.g., the speed of the clock) to a first frequency (e.g., a first speed) that is less than the frequency of the clock (e.g., the speed of the clock). Additionally, in response to the other determination that the voltage monitored by the voltage detector 202 is equal to or above the defined threshold after being below the defined threshold, the controller 106 can increase the first frequency (e.g., the first speed) of the clock (e.g., the provided to the microprocessor 102) to a second frequency (e.g., a second speed) that is greater than the first frequency (e.g., the first speed). Then, the controller 106 can increase the second frequency (e.g., the second speed) of the clock to a third frequency (e.g., a third speed) that is greater than the second frequency (e.g., the second speed).

Figure 3:
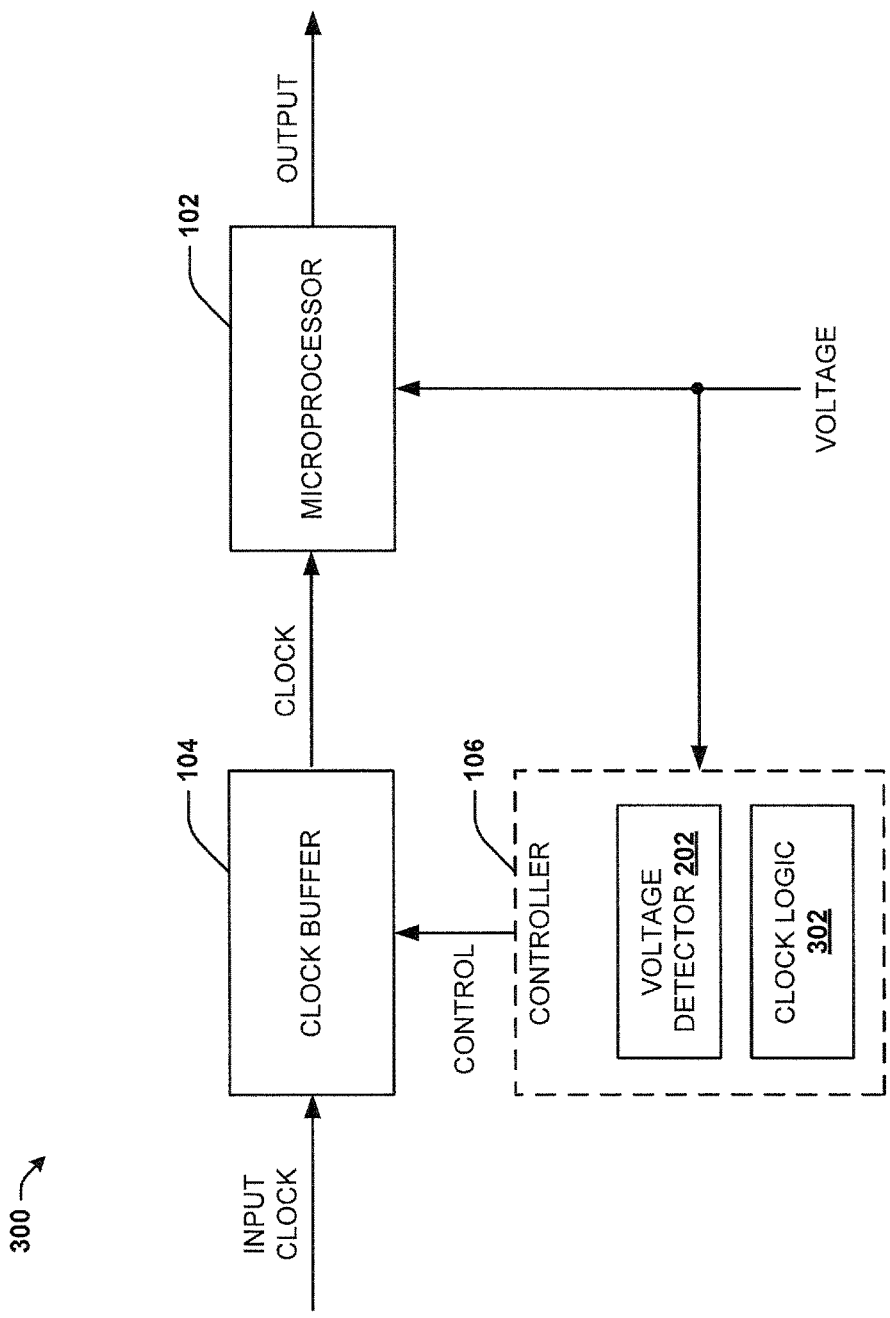
FIG. 3 is a block diagram illustrating another example, non-limiting embodiment of a controller included in a microprocessor system in accordance with various aspects described herein.

Referring now to FIG. 3, a block diagram illustrating an example, non-limiting embodiment of a system 300 in accordance with various aspects described herein is shown. System 300 includes the microprocessor 102, the clock buffer 104 and the controller 106. The controller 106 includes the voltage detector 202 and/or clock logic 302.

Figure 7:
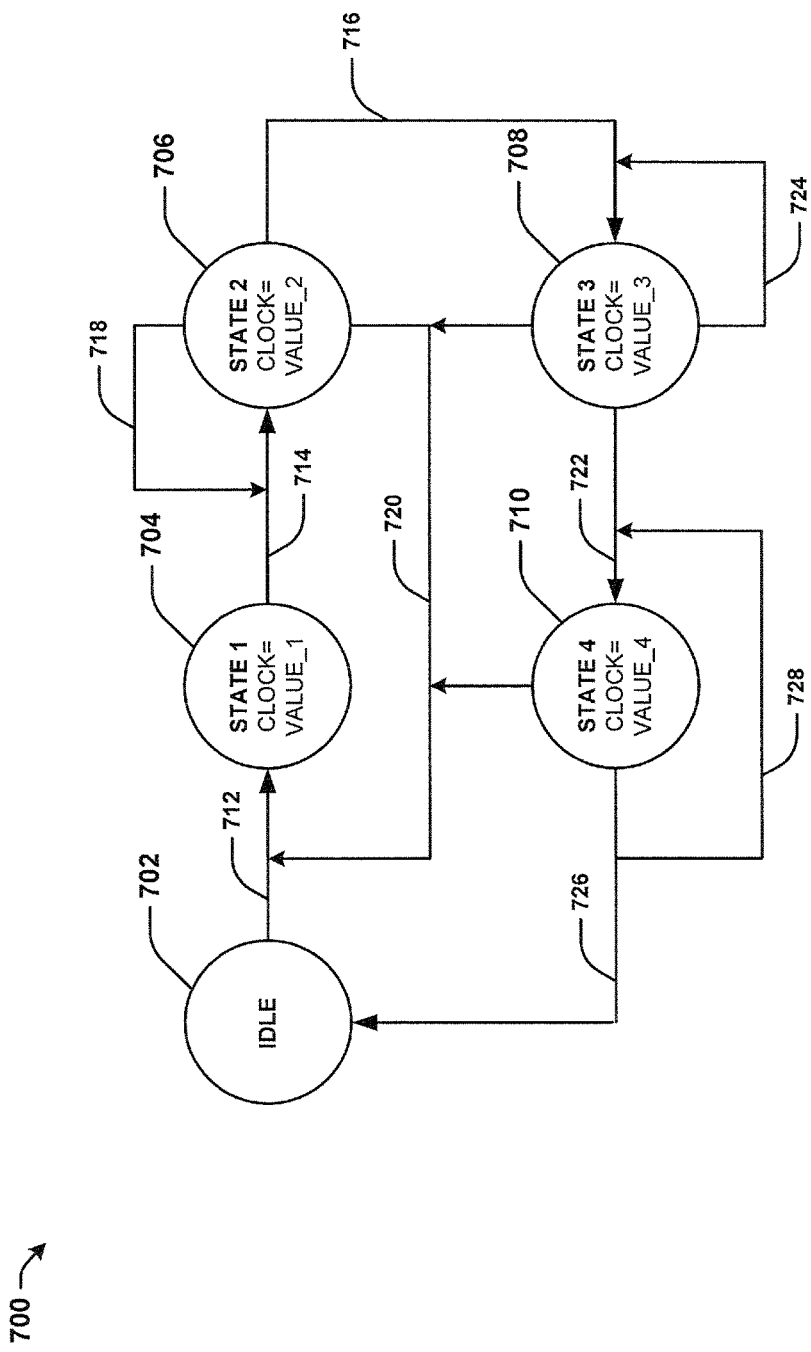
FIG. 7 illustrates an example, non-limiting embodiment of a state diagram for voltage droop mitigation in accordance with various aspects described herein.

The clock logic 302 can configure the control signal provided to the clock buffer 104 and/or can configure the clock provided by the clock buffer 104 based on information associated with the voltage detector 202. For example, the clock logic 302 can reduce a frequency of the clock (e.g., a speed of the clock) provided to the microprocessor 102, as more fully disclosed herein, in response to a determination that the voltage monitored by the voltage detector 202 is below a defined threshold. Furthermore, the clock logic 302 can incrementally increasing the frequency of the clock (e.g., the speed of the clock) provided to the microprocessor 102, as more fully disclosed herein, in response to another determination that the voltage monitored by the voltage detector 202 is equal to or above the defined threshold after being below the defined threshold. In an aspect, the clock logic 302 can be associated with a state diagram (e.g., as shown in FIG. 7). For example, the clock logic 302 can incrementally increase the frequency of the clock (e.g., the speed of the clock) provided to the microprocessor 102 based on a logic associated with a state diagram.

Figure 4:
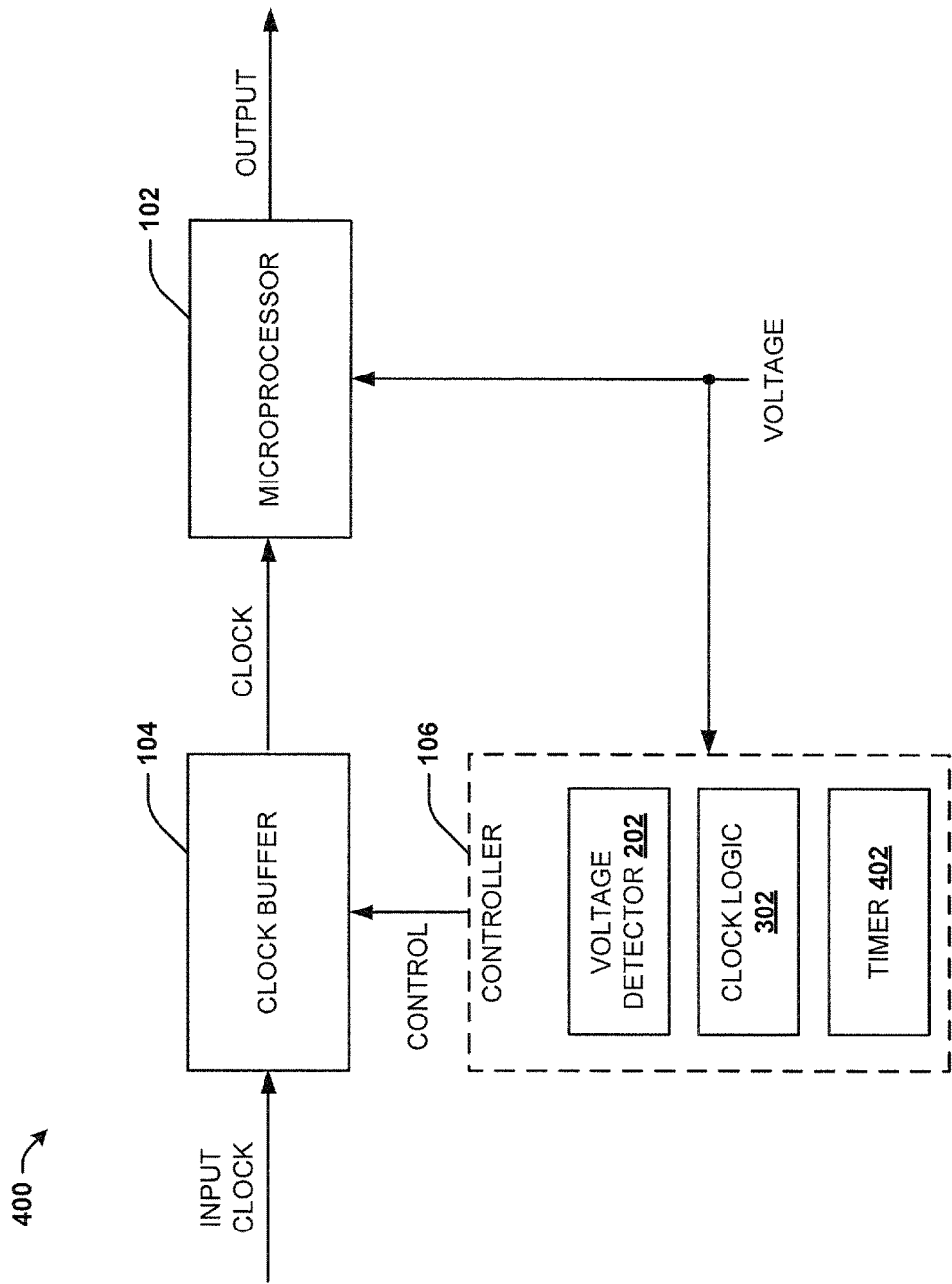
FIG. 4 is a block diagram illustrating yet another example, non-limiting embodiment of a controller included in a microprocessor system in accordance with various aspects described herein.

Referring now to FIG. 4, a block diagram illustrating an example, non-limiting embodiment of a system 400 in accordance with various aspects described herein is shown. System 400 includes the microprocessor 102, the clock buffer 104 and the controller 106. The controller 106 includes the voltage detector 202, the clock logic 302 and/or a timer 402.

The controller 106 (e.g., the clock logic 302) can, additionally or alternatively, incrementally increase the frequency of the clock (e.g., the speed of the clock) provided to the microprocessor 102 based on the timer 402. For example, the timer 402 can determine a defined period of time in connection with incrementally increasing a frequency of a clock. In one example, in response to the determination that the voltage monitored by the voltage detector 202 is below the defined threshold, the controller 106 (e.g., the clock logic 302) can reduce the frequency of the clock (e.g., the speed of the clock) provided by the clock buffer 104 to a first frequency (e.g., a first speed) that is less than the frequency of the clock (e.g., the speed of the clock). Additionally, in response to the other determination that the voltage monitored by the voltage detector 202 is equal to or above the defined threshold after being below the defined threshold, the controller 106 (e.g., the clock logic 302) can increase the first frequency (e.g., the first speed) of the clock provided by the clock buffer 104 to a second frequency (e.g., a second speed) that is greater than the first frequency (e.g., the first speed). Then, the controller 106 (e.g., the clock logic 302) can increase the second frequency (e.g., the second speed) of the clock provided by the clock buffer 104 to a third frequency (e.g., a third speed) that is greater than the second frequency (e.g., the second speed). The controller 106 (e.g., the clock logic 302) can increase the second frequency to the third frequency after a defined period of time that is defined and/or managed by the timer 402. In certain implementations, the controller 106 (e.g., the clock logic 302) can also increase the third frequency to a fourth frequency after another defined period of time that is defined and/or managed by the timer 402. The other defined period of time can be equal to the defined period of time. Alternatively, the other defined period of time can be different than the defined period of time. In one example, the defined period of time can be tuned to match a frequency response of a device (e.g., a chip, a circuit, a package, a die, etc.) associated with the system 400. In another example, the timer 402 can be associated with a state diagram (e.g., as shown in FIG. 7).

Figure 5:
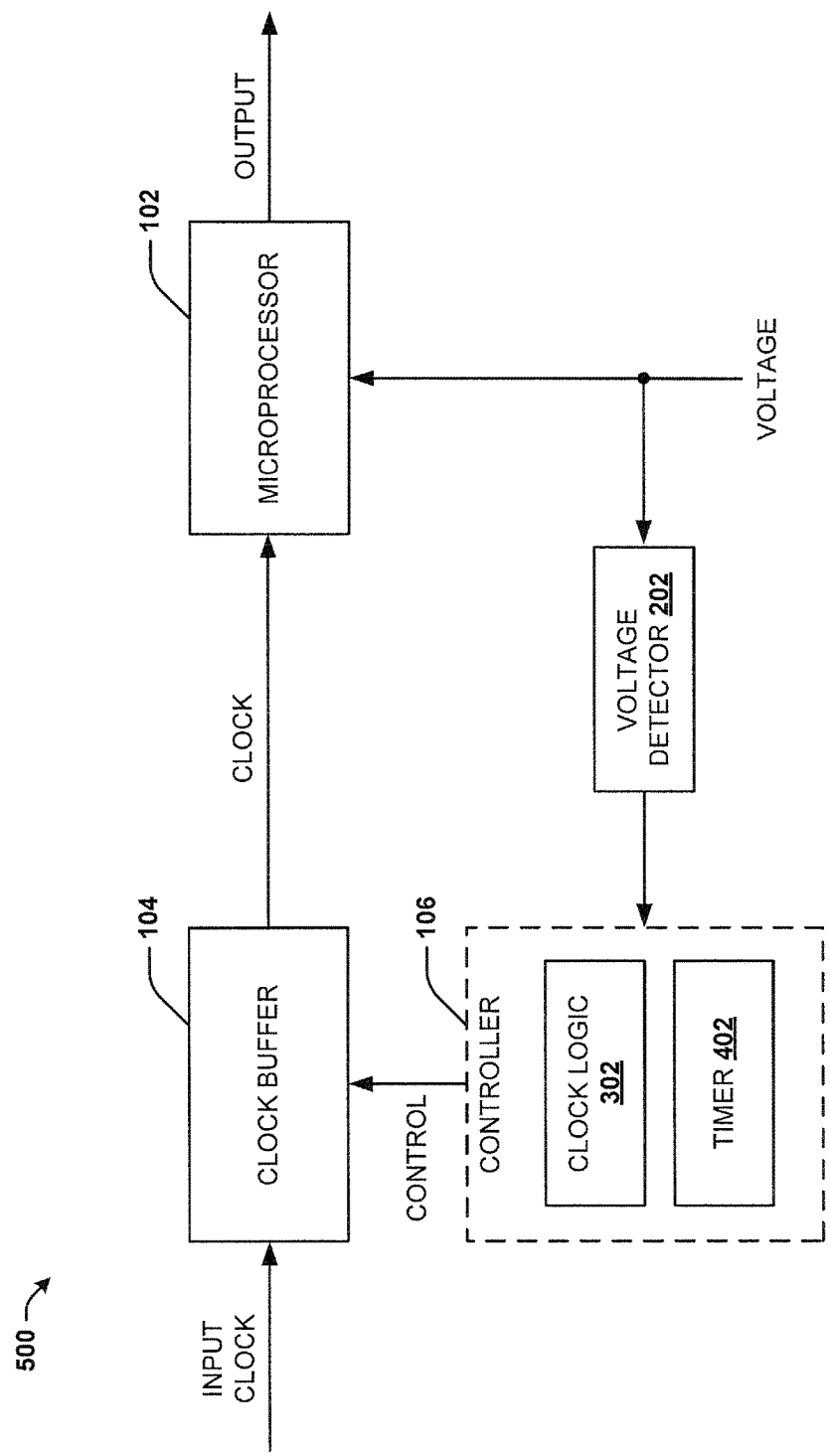
FIG. 5 is a block diagram illustrating another example, non-limiting embodiment of a microprocessor system in accordance with various aspects described herein.

Referring now to FIG. 5, a block diagram illustrating an example, non-limiting embodiment of a system 500 in accordance with various aspects described herein is shown. System 500 includes the microprocessor 102, the clock buffer 104 and the controller 106. The controller 106 includes the clock logic 302 and/or the timer 402. The voltage detector 202 can be coupled to the controller 106 and a communication line associated with the voltage (e.g., VOLTAGE) received by the microprocessor 102. In one, the voltage detector 202 can be a hardware voltage detector circuit (e.g., an analog voltage detector circuit). In another example, the voltage detector 202 can include software functionality for detecting voltage. In yet another example, the voltage detector 202 can be a combination of hardware voltage detector circuitry and software functionality for detecting voltage.

Figure 6:
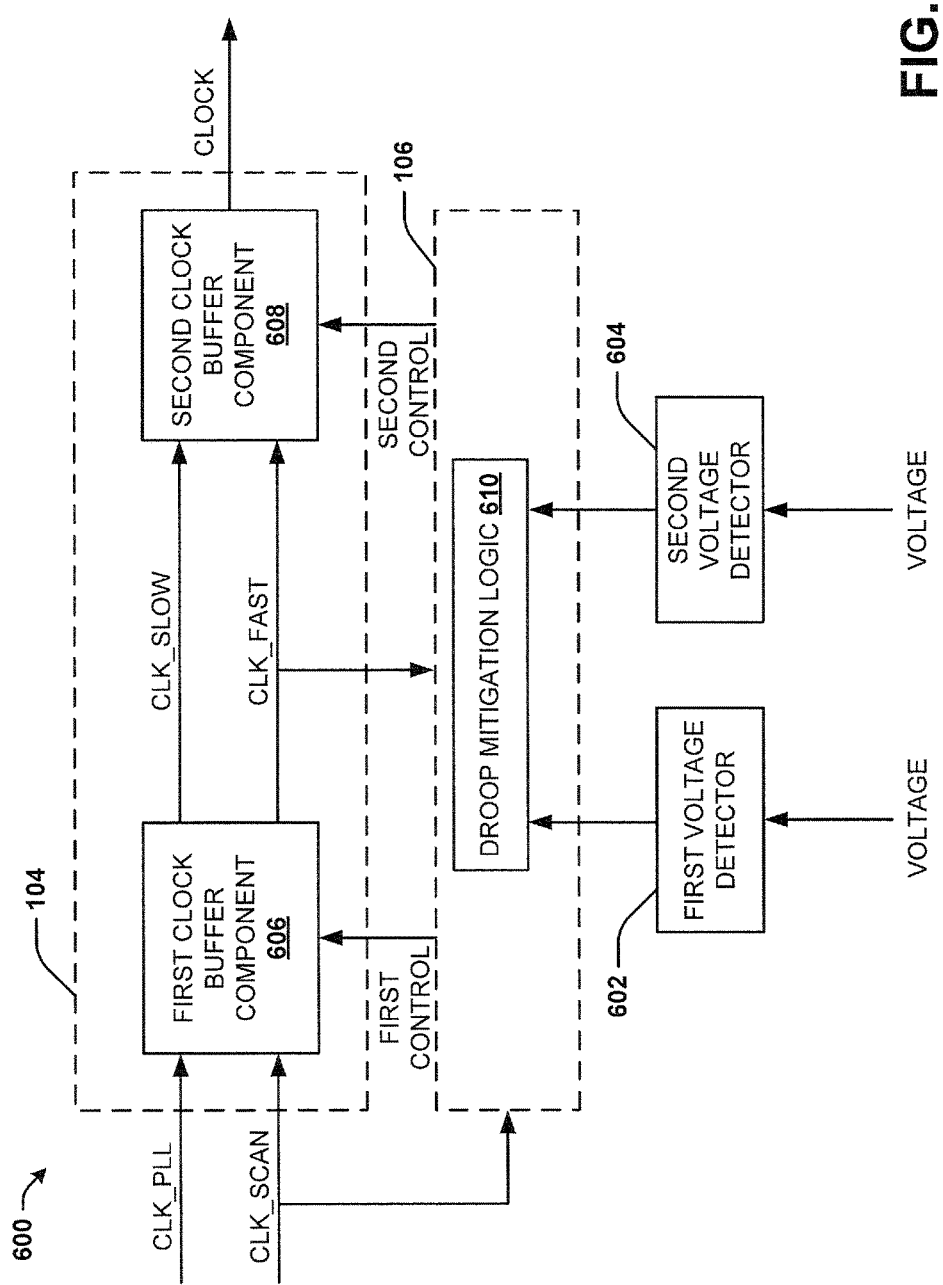
FIG. 6 is a block diagram illustrating an example, non-limiting embodiment of system that includes droop mitigation logic in accordance with various aspects described herein.

Referring now to FIG. 6, a block diagram illustrating an example, non-limiting embodiment of a system 600 in accordance with various aspects described herein is shown. System 600 includes the clock buffer 104, the controller 106, a first voltage detector 602 and a second voltage detector 604. In an implementation, the first voltage detector 602 and the second voltage detector 604 can be associated with and/or included in the voltage detector 202.

The clock buffer 104 can include a first clock buffer component 606 and a second clock buffer component 608. The first clock buffer component 606 can receive a first input clock (e.g., CLK_PLL shown in FIG. 6) and a second input clock (e.g., CLK_SCAN shown in FIG. 6). The first input clock (e.g., CLK_PLL) can be an input clock received off-chip (e.g., from a device that is not included on a chip associated with the clock buffer 104). The second input clock (e.g., CLK_SCAN) can be an input clock received from a phase-locked loop (PLL).

The first voltage detector 602 and the second voltage detector 604 can be configured to detect voltage anomalies associated with the voltage (e.g., VOLTAGE). For example, the first voltage detector 602 and the second voltage detector 604 can receive a same voltage supply. In an aspect, the first voltage detector 602 and/or the second voltage detector 604 can be connected to a communication line associated with the voltage and/or the microprocessor 102. The first voltage detector 602 and the second voltage detector 604 can be biased so that the first voltage detector 602 detects a different voltage event than the second voltage detector 602 in response to the voltage (e.g., the same supply voltage). The first voltage detector 602 can be configured to detect relative voltage droop associated with the voltage (e.g., VOLTAGE). In one example, the first voltage detector 602 can compare the voltage (e.g., VOLTAGE) to a filtered version of the voltage (e.g., a low-pass filtered version of the voltage, etc.). For example, the first voltage detector 602 can include a filter (e.g., a low-pass filter) that can generate the filtered version of the voltage. In another example, the first voltage detector 602 can be coupled to a filter (e.g., a low-pass filter) that can generate the filtered version of the voltage.

The second voltage detector 604 can be configured to observe a different voltage profile (e.g., a different noise profile) than the first voltage detector 604. The second voltage detector 604 can be configured to detect an absolute voltage droop associated with the voltage (e.g., VOLTAGE). In one example, the second voltage detector 604 can compare the voltage (e.g., VOLTAGE) to a reference voltage (e.g., a reference voltage received from off-die, etc.). For example, the second voltage detector 604 can receive the reference voltage. Alternatively, the second voltage detector 604 can store a value for the reference voltage.

The controller 106 can include droop mitigation logic 610. For example, the droop mitigation logic 601 can be associated with and/or can include the clock logic 302 and/or the timer 402. The droop mitigation logic 610 can detect a voltage droop event via the first voltage detector 602 and/or the second voltage detector 604. Additionally, the droop mitigation logic 610 can respond to a voltage droop event. For example, based on feedback from the first voltage detector 602 and/or the second voltage detector 604, the droop mitigation logic 610 can generate a first control signal (e.g., FIRST CONTROL shown in FIG. 6) for the first clock buffer component 606 and/or a second control signal (e.g., SECOND CONTROL shown in FIG. 6) for the second clock buffer component 608. The first control signal can be a control signal associated with configuration of a clock value generated by the clock buffer 104. The second control signal can be a control signal to control multiplexer functionality associated with the second clock buffer component 608.

The first clock buffer component 606 can generate a first defined clock (e.g., CLK_SLOW shown in FIG. 6) and a second defined clock (e.g., CLK_FAST shown in FIG. 6) based on the first input clock (e.g., CLK_PLL), the second input clock (e.g., CLK_SCAN) and/or the first control signal (e.g., FIRST CONTROL). The first defined clock (e.g., CLK_SLOW) can be associated with a slower clock frequency than the second defined clock. The second defined clock (e.g., CLK_FAST) can be, for example, a normal clock frequency provided to the microprocessor 102. The second clock buffer component 608 can select the first defined clock (e.g., CLK_SLOW) or the second defined clock (e.g., CLK_FAST) based on the second control signal (e.g., SECOND CONTROL). Therefore, either the first defined clock (e.g., CLK_SLOW) or the second defined clock (e.g., CLK_FAST) can be outputted as the clock (e.g., CLOCK) provided to the microprocessor 102. In an aspect, the second input clock (e.g., CLK_SCAN) and/or the second defined clock (e.g., CLK_FAST) can be provided as feedback to the controller 106.

FIG. 7 illustrates an example, non-limiting embodiment of a state diagram 700 in accordance with various aspects described herein is shown. The state diagram 700 can facilitate voltage droop mitigation. In an aspect, the state diagram 700 can be associated with the controller 106, the clock logic 302, the timer 402 and/or the droop mitigation logic 610. The state diagram 700 includes an idle state 702 (e.g., IDLE shown in FIG. 7), a first state 704 (e.g., STATE 1 shown in FIG. 7), a second state 706 (e.g., STATE 2 shown in FIG. 7), a third state 708 (e.g., STATE 3 shown in FIG. 7) and a fourth state 710 (e.g., STATE 4 shown in FIG. 7).

The idle state 702 can be associated with a normal voltage level for the voltage provided to the microprocessor 102. For example, the idle state 702 can be associated with a voltage level that is at or above a defined threshold (e.g., a voltage level that is not associated with a voltage droop event). In response to an event (e.g., a voltage droop event) associated with the voltage, the state diagram 700 can exit the idle state 702 and can proceed to the first state 704 via path 712. For example, in response to a determination that the voltage is below the defined threshold, the state diagram 700 can exit the idle state 702 and can proceed to the first state 704 via path 712. At the first state 704, a clock associated with the clock buffer 104 can be set to a first value (e.g., CLK=VALUE_1 shown in FIG. 7). For example, a frequency of the clock associated with the clock buffer 104 can be reduced (e.g., to a first frequency, to first defined clock of FIG. 6, etc.). In response to a determination that the voltage is no longer associated with the event (e.g., the voltage droop event), the state diagram 700 can exit the first state 704 and can proceed to the second state 706 via path 714. For example, in response to a determination that the voltage is at or above the defined threshold, the state diagram 700 can exit the first state 704 and can proceed to the second state 706 via path 714.

At the second state 706, the first value of the clock associated with the first state 704 can be increased to a second value (e.g., CLK=VALUE_2 shown in FIG. 7). The second value of the clock can be greater than the first value of the clock, but less than a value of the clock associated with the idle state 702. For example, in the second state 706, a frequency of the clock associated with the first state 704 can be increased by a certain amount so that a current value of the frequency of the clock is less than a value of the frequency of the clock when in the idle state 702. The state diagram 700 can be in the second state 706 for a first defined period of time (e.g., determined by the timer 402). In response to a determination that the voltage is still no longer associated with the event (e.g., the voltage droop event) and that the first defined period of time has been reached, the state diagram 700 can exit the second state 706 and can proceed to the third state 708 via path 716. For example, in response to a determination that the voltage is still at or above the defined threshold and that the first defined period of time has been reached, the state diagram 700 can exit the second state 706 and can proceed to the third state 708 via path 716. Additionally or alternatively, in response to a determination that the voltage is still no longer associated with the event (e.g., the voltage droop event) and that the first defined period of time has not been reached, the state diagram 700 can remain to the second state 706 via path 718. However, in response to a determination that the voltage is again associated with the event (e.g., the voltage droop event), the state diagram 700 can exit the second state 706 and can return to the first state 704 via path 720. For example, in response to a determination that the voltage is below the defined threshold, the state diagram 700 can exit the second state 706 and can return to the first state 704 via path 720.

At the third state 708, the second value of the clock associated with the second state 706 can be increased to a third value (e.g., CLK=VALUE_3 shown in FIG. 7). The third value of the clock can be greater than the second value of the clock, but less than a value of the clock associated with the idle state 702. For example, in the third state 708, a frequency of the clock associated with the second state 706 can be increased by a certain amount so that a current value of the frequency of the clock is less than a value of the frequency of the clock when in the idle state 702. The state diagram 700 can be in the third state 708 for a second defined period of time (e.g., determined by the timer 402). In one example, the second defined period of time can be the same as the first defined period of time. In another example, the second defined period of time can be different than the first defined period of time. In response to a determination that the voltage is still no longer associated with the event (e.g., the voltage droop event) and that the second defined period of time has been reached, the state diagram 700 can exit the third state 708 and can proceed to the fourth state 710 via path 722. For example, in response to a determination that the voltage is still at or above the defined threshold and that the second defined period of time has been reached, the state diagram 700 can exit the third state 708 and can proceed to the fourth state 710 via path 718. Additionally or alternatively, in response to a determination that the voltage is still no longer associated with the event (e.g., the voltage droop event) and that the second defined period of time has not been reached, the state diagram 700 can remain to the third state 708 via path 724. However, in response to a determination that the voltage is again associated with the event (e.g., the voltage droop event), the state diagram 700 can exit the third state 708 and can return to the first state 704 via path 720. For example, in response to a determination that the voltage is below the defined threshold, the state diagram 700 can exit the third state 708 and can return to the first state 704 via path 720.

At the fourth state 710, the third value of the clock associated with the third state 708 can be increased to a fourth value (e.g., CLK=VALUE_4 shown in FIG. 7). The fourth value of the clock can be greater than the third value of the clock, but less than a value of the clock associated with the idle state 702. For example, in the fourth state 710, a frequency of the clock associated with the third state 708 can be increased by a certain amount so that a current value of the frequency of the clock is less than a value of the frequency of the clock when in the idle state 702. The state diagram 700 can be in the fourth state 710 for a third defined period of time (e.g., determined by the timer 402). In one example, the third defined period of time can be the same as the first defined period of time and/or the second defined period of time. In another example, the third defined period of time can be different than the first defined period of time and/or the second defined period of time. In response to a determination that the voltage is still no longer associated with the event (e.g., the voltage droop event) and that the third defined period of time has been reached, the state diagram 700 can exit the fourth state 710 and can proceed to the idle state 702 via path 726. For example, in response to a determination that the voltage is still at or above the defined threshold and that the third defined period of time has been reached, the state diagram 700 can exit the fourth state 710 and can proceed to the idle state 702 via path 724. Additionally or alternatively, in response to a determination that the voltage is still no longer associated with the event (e.g., the voltage droop event) and that the third defined period of time has not been reached, the state diagram 700 can remain to the fourth state 710 via path 728. However, in response to a determination that the voltage is again associated with the event (e.g., the voltage droop event), the state diagram 700 can exit the fourth state 710 and can return to the first state 704 via path 720. For example, in response to a determination that the voltage is below the defined threshold, the state diagram 700 can exit the fourth state 710 and can return to the first state 704 via path 720. When the state diagram 700 is back at the idle state 702, the fourth value of the clock associated with the fourth state 710 can be increased to the original clock value before entering the first state 704 (e.g., before the voltage droop event).

In certain implementations, aspects of the systems, apparatuses or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. For example, a system can include a memory for storing computer executable components and instructions. Furthermore, the system can include a processor to facilitate operation of the instructions (e.g., computer executable components and instructions) by the system.

Figure 8:
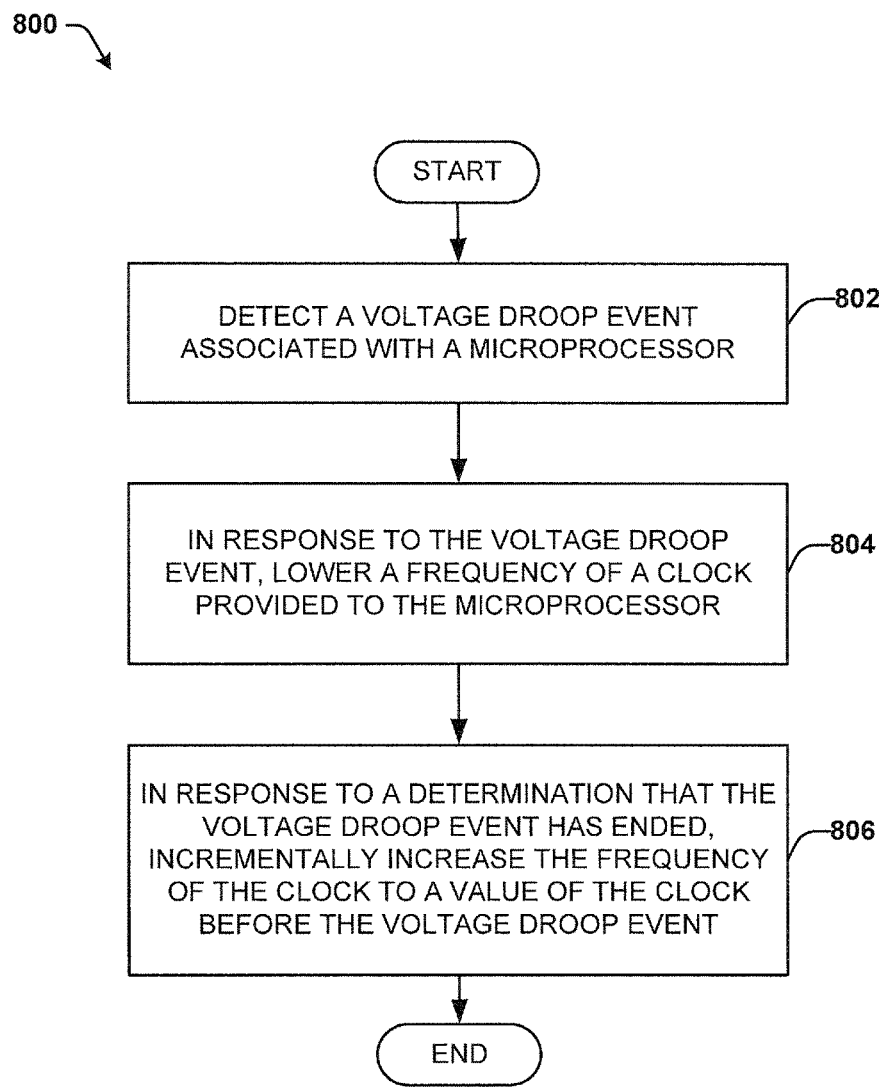
FIG. 8 illustrates a flow diagram of an example, non-limiting embodiment of a method for mitigating voltage droop associated with a microprocessor.
Figure 9:
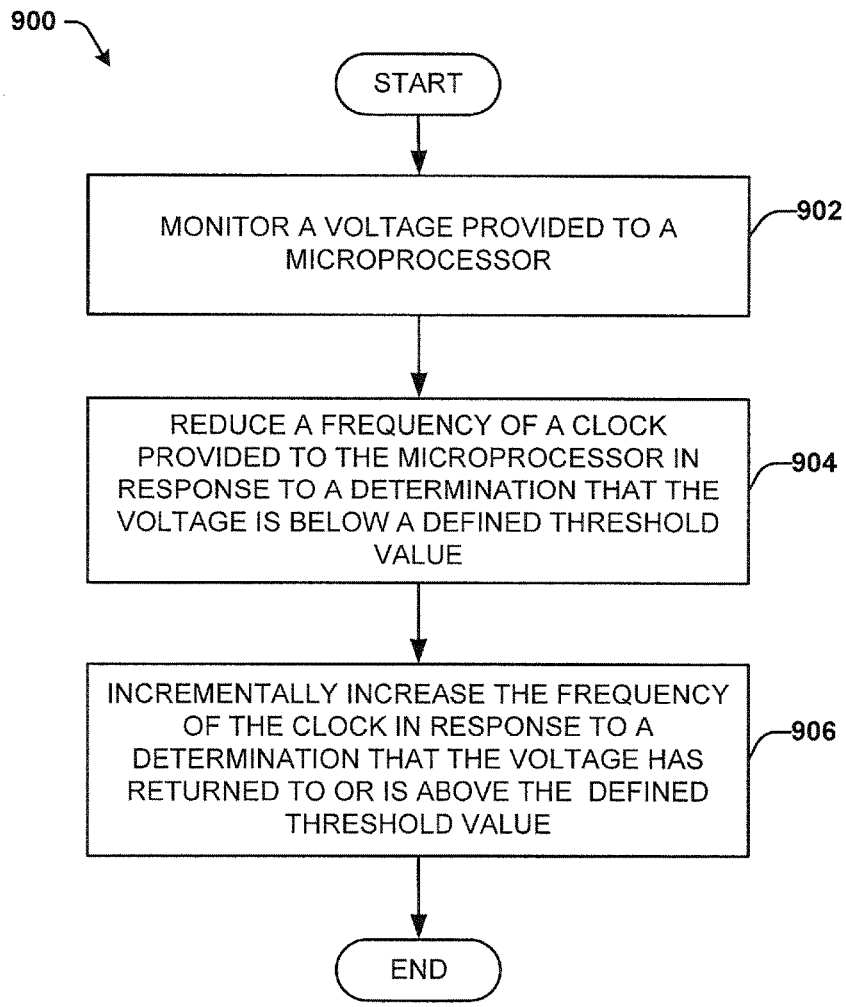
FIG. 9 illustrates a flow diagram of another example, non-limiting embodiment of a method for mitigating voltage droop associated with a microprocessor.
Figure 10:
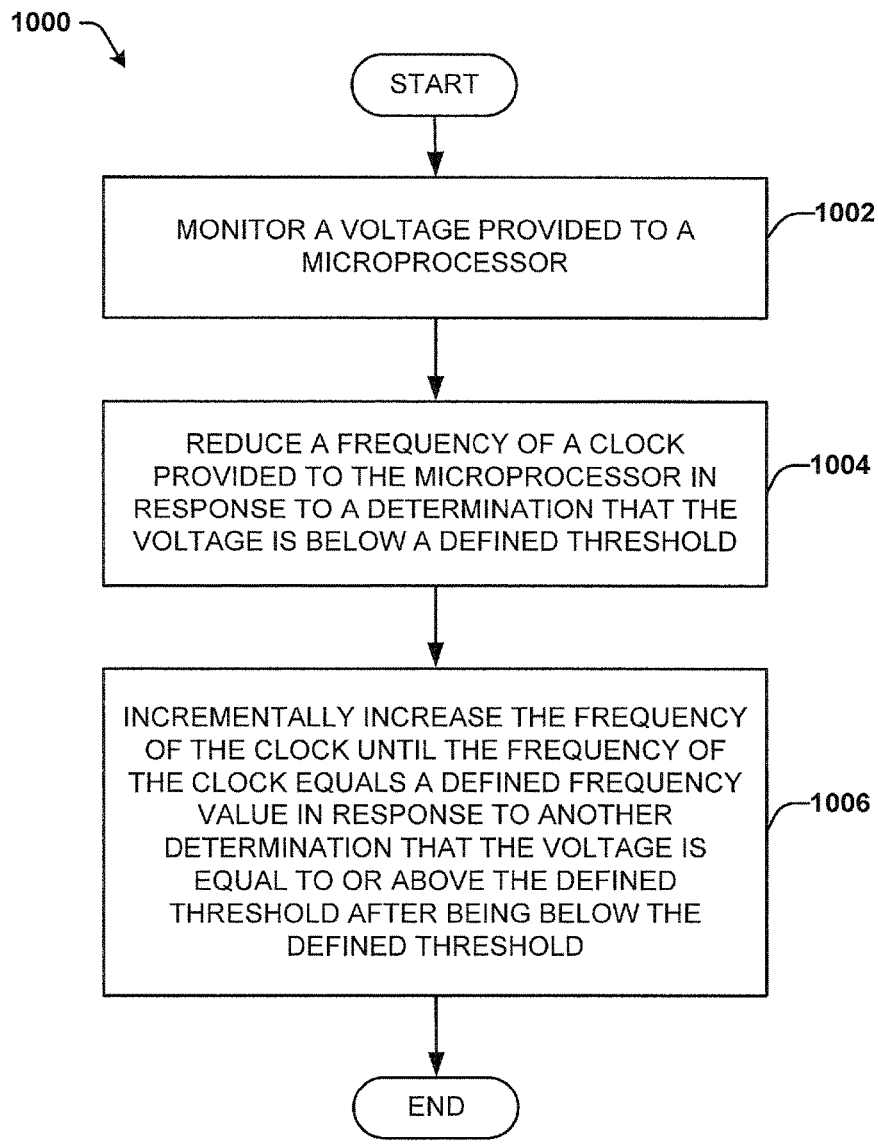
FIG. 10 illustrates a flow diagram of yet another example, non-limiting embodiment of a method for mitigating voltage droop associated with a microprocessor.

In view of the example systems described above, methods that may be implemented in accordance with the described subject matter may be better appreciated with reference to the flow charts of FIGS. 8-10. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Referring to FIG. 8, a flow diagram of an example, non-limiting embodiment of a method for mitigating voltage droop associated with a microprocessor is shown. Method 800 can begin at block 802, where a voltage droop event associated with a microprocessor is detected. For example, the voltage droop event can be detected when a voltage (e.g., a supply voltage) provided to the microprocessor is below a defined threshold (e.g., a defined voltage level). At block 804, a frequency of a clock provided to the microprocessor is lowered in response to the voltage droop event. For example, the frequency of the clock provided to the microprocessor can be lowered to a defined clock frequency that is lower than the frequency of the clock before the voltage droop event. In another example, the frequency of the clock can be lowered by lowering an input clock. At block 806, the frequency of the clock is incrementally increased to a value of the clock before the voltage droop event in response to a determination that the voltage droop event has ended. For example, the frequency of the clock provided to the microprocessor can be incrementally increased until the frequency of the clock reaches a defined clock frequency that corresponds to the frequency of the clock before the voltage droop event.

Referring to FIG. 9, a flow diagram of another example, non-limiting embodiment of a method for mitigating voltage droop associated with a microprocessor is shown. Method 900 can begin at block 902, where a voltage provided to a microprocessor is monitored. For example, one or more voltage detection circuits can continuously monitor the voltage provided to the microprocessor and/or a communication line associated with the voltage provided to the microprocessor. At block 904, a frequency of a clock provided to the microprocessor is reduced in response to a determination that the voltage is below a defined threshold value. For example, the frequency of the clock provided to the microprocessor can be reduced to a defined clock frequency that is lower than the frequency of the clock before the voltage reached the defined threshold value. The one or more voltage detection circuits can determine that the voltage is below the defined threshold value.

At block 906, the frequency of the clock is incrementally increased in response to a determination that the voltage has returned to or is above the defined threshold value. For example, the frequency of the clock provided to the microprocessor can be incrementally increased until the frequency of the clock reaches a defined clock frequency that corresponds to the frequency of the clock before the voltage reached the defined threshold value. The one or more voltage detection circuits can determine that the voltage has returned to or is above the defined threshold value.

In an alternate implementation, at block 904, the frequency of a clock provided to the microprocessor can be reduced in response to a determination that the voltage is above a defined threshold value. Therefore, at block 906, the frequency of the clock can be incrementally increased in response to a determination that the voltage has returned to or is below the defined threshold value.

Referring to FIG. 10, a flow diagram of yet another example, non-limiting embodiment of a method for mitigating voltage droop associated with a microprocessor is shown. Method 1000 can begin at block 1002, where a voltage provided to a microprocessor is monitored. For example, one or more voltage detection circuits can continuously monitor the voltage provided to the microprocessor and/or a communication line associated with the voltage provided to the microprocessor.

At block 1004, a frequency of a clock provided to the microprocessor is reduced in response to a determination that the voltage is below a defined threshold. For example, the frequency of the clock can be reduced to a first frequency that is less than the frequency of the clock. In an aspect, the frequency of the clock can be divided to reduce the frequency of the clock. The one or more voltage detection circuits can determine that the voltage is below the defined threshold value.

At block 1006, the frequency of the clock is incrementally increased until the frequency of the clock equals a defined frequency value in response to another determination that the voltage is equal to or above the defined threshold after being below the defined threshold. For example, the frequency of the clock can be incrementally increased until the frequency reaches a frequency level that corresponds to the frequency of the clock before the voltage reached the defined threshold value. In an aspect, the first frequency of the clock can be increased to a second frequency that is greater than the first frequency that is less than the frequency of the clock before the voltage reached the defined threshold value. Additionally, the second frequency of the clock can be increased to a third frequency that is greater than the second frequency after a defined period of time. If the third frequency does not correspond to the frequency of the clock before the voltage reached the defined threshold value, the third frequency can be increased to fourth frequency that is greater than the third frequency, etc. until the frequency reaches a frequency level that corresponds to the frequency of the clock before the voltage reached the defined threshold value. The one or more voltage detection circuits can determine that the voltage has returned to or is above the defined threshold value.

In an alternate implementation, at block 1004, the frequency of the clock provided to the microprocessor can be reduced in response to a determination that the voltage is above a defined threshold. Therefore, at block 1006, the frequency of the clock can be incrementally increased until the frequency of the clock equals a defined frequency value in response to another determination that the voltage is equal to or below the defined threshold after being above the defined threshold.

Example Computing Environment

Figure 11:
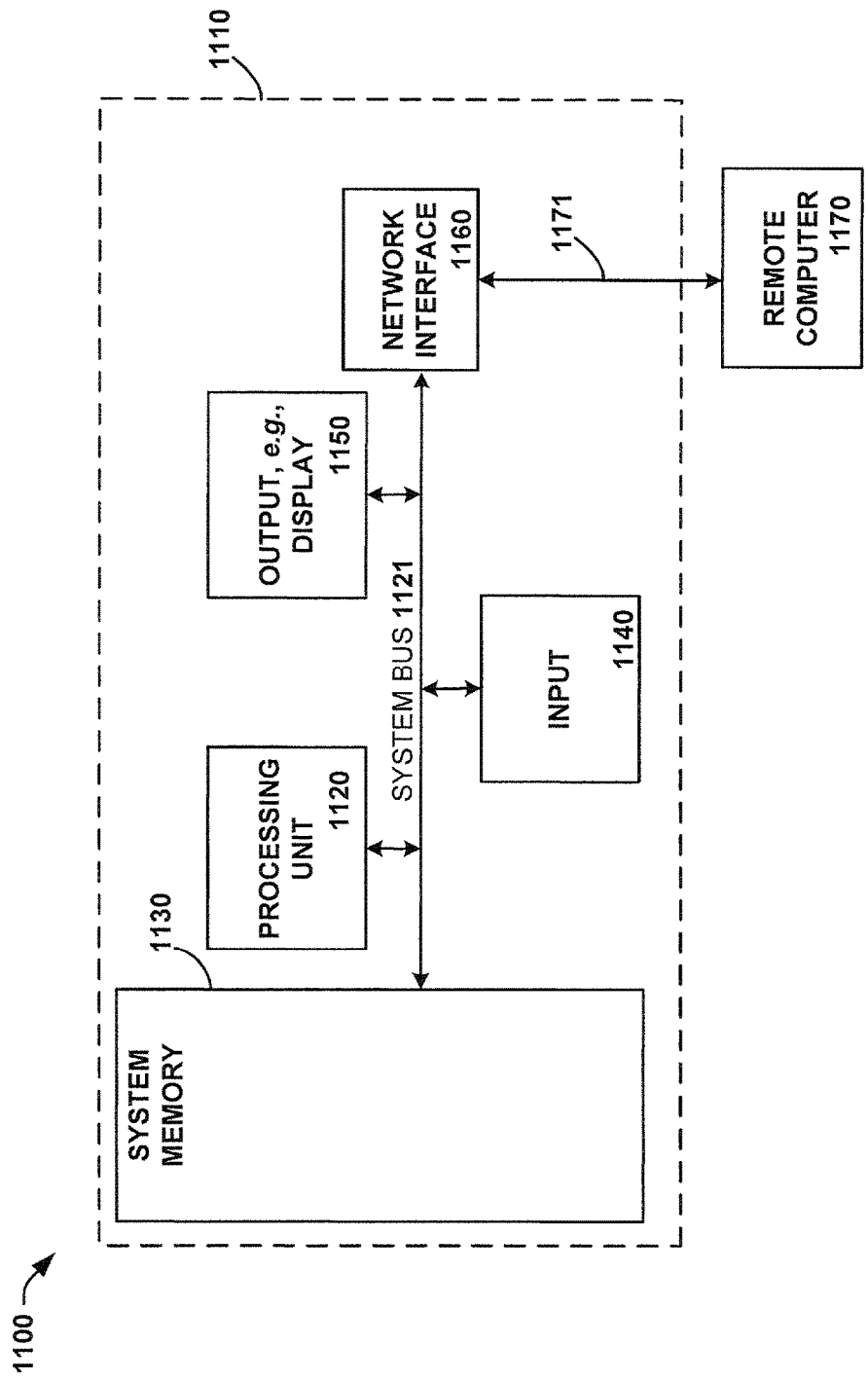
FIG. 11 illustrates a block diagram of an example electronic computing environment that can be implemented in conjunction with one or more aspects described herein.

As mentioned, advantageously, the techniques described herein can be applied to any device where it is desirable to mitigate voltage droop and/or voltage noise associated with a microprocessor. It is to be understood, therefore, that handheld, portable and other computing devices and computing objects of all kinds are contemplated for use in connection with the various non-limiting embodiments, i.e., anywhere that a device may wish to mitigate voltage droop and/or voltage noise associated with a microprocessor. Accordingly, the below general purpose remote computer described below in FIG. 11 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 11 thus illustrates an example of a suitable computing system environment 1100 in which some aspects of the disclosed subject matter can be implemented, although as made clear above, the computing system environment 1100 is only one example of a suitable computing environment for a device and is not intended to suggest any limitation as to the scope of use or functionality of the disclosed subject matter. Neither should the computing environment 1100 be interpreted as having any dependency or requirement relating to any one or combination of components illustrated in the exemplary operating environment 1100.

With reference to FIG. 11, an exemplary device for implementing the disclosed subject matter includes a general-purpose computing device in the form of a computer 1110. Components of computer 1110 may include, but are not limited to, a processing unit 1120, a system memory 1130, and a system bus 1121 that couples various system components including the system memory to the processing unit 1120. The system bus 1121 may be any of several types of bus structures including a memory bus or memory controller, a peripheral bus, and a local bus using any of a variety of bus architectures.

Computer 1110 typically includes a variety of computer readable media. Computer readable media can be any available media that can be accessed by computer 1110. By way of example, and not limitation, computer readable media can comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 1110. Communication media typically embodies computer readable instructions, data structures, program modules, or other data in a modulated data signal such as a carrier wave or other transport mechanism and includes any information delivery media.

The system memory 1130 may include computer storage media in the form of volatile and/or nonvolatile memory such as read only memory (ROM) and/or random access memory (RAM). A basic input/output system (BIOS), containing the basic routines that help to transfer information between elements within computer 1110, such as during start-up, may be stored in memory 1130. Memory 1130 typically also contains data and/or program modules that are immediately accessible to and/or presently being operated on by processing unit 1120. By way of example, and not limitation, memory 1130 may also include an operating system, application programs, other program modules, and program data.

The computer 1110 may also include other removable/non-removable, volatile/nonvolatile computer storage media. For example, computer 1110 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 1121 through a non-removable memory interface such as an interface, and a magnetic disk drive or optical disk drive is typically connected to the system bus 1121 by a removable memory interface, such as an interface.

A user can enter commands and information into the computer 1110 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 1120 through user input 1140 and associated interface(s) that are coupled to the system bus 1121, but may be connected by other interface and bus structures, such as a parallel port, game port, or a universal serial bus (USB). A graphics subsystem can also be connected to the system bus 1121. A projection unit in a projection display device, or a HUD in a viewing device or other type of display device can also be connected to the system bus 1121 via an interface, such as output interface 1150, which may in turn communicate with video memory. In addition to a monitor, computers can also include other peripheral output devices such as speakers which can be connected through output interface 1150.

The computer 1110 can operate in a networked or distributed environment using logical connections to one or more other remote computer(s), such as remote computer 1170, which can in turn have media capabilities different from computer 1110. The remote computer 1170 can be a personal computer, a server, a router, a network PC, a peer device, personal digital assistant (PDA), cell phone, hand-held computing device, a projection display device, a viewing device, or other common network node, or any other remote media consumption or transmission device, and may include any or all of the elements described above relative to the computer 1110. The logical connections depicted in FIG. 11 include a network 1171, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 1110 can be connected to the LAN 1171 through a network interface or adapter. When used in a WAN networking environment, the computer 1110 can typically include a communications component, such as a modem, or other means for establishing communications over the WAN, such as the Internet. A communications component, such as wireless communications component, a modem and so on, which can be internal or external, can be connected to the system bus 1121 via the user input interface of input 1140, or other appropriate mechanism. In a networked environment, program modules depicted relative to the computer 1110, or portions thereof, can be stored in a remote memory storage device. It will be appreciated that the network connections shown and described are exemplary and other means of establishing a communications link between the computers can be used.

Example Networking Environment

Figure 12:
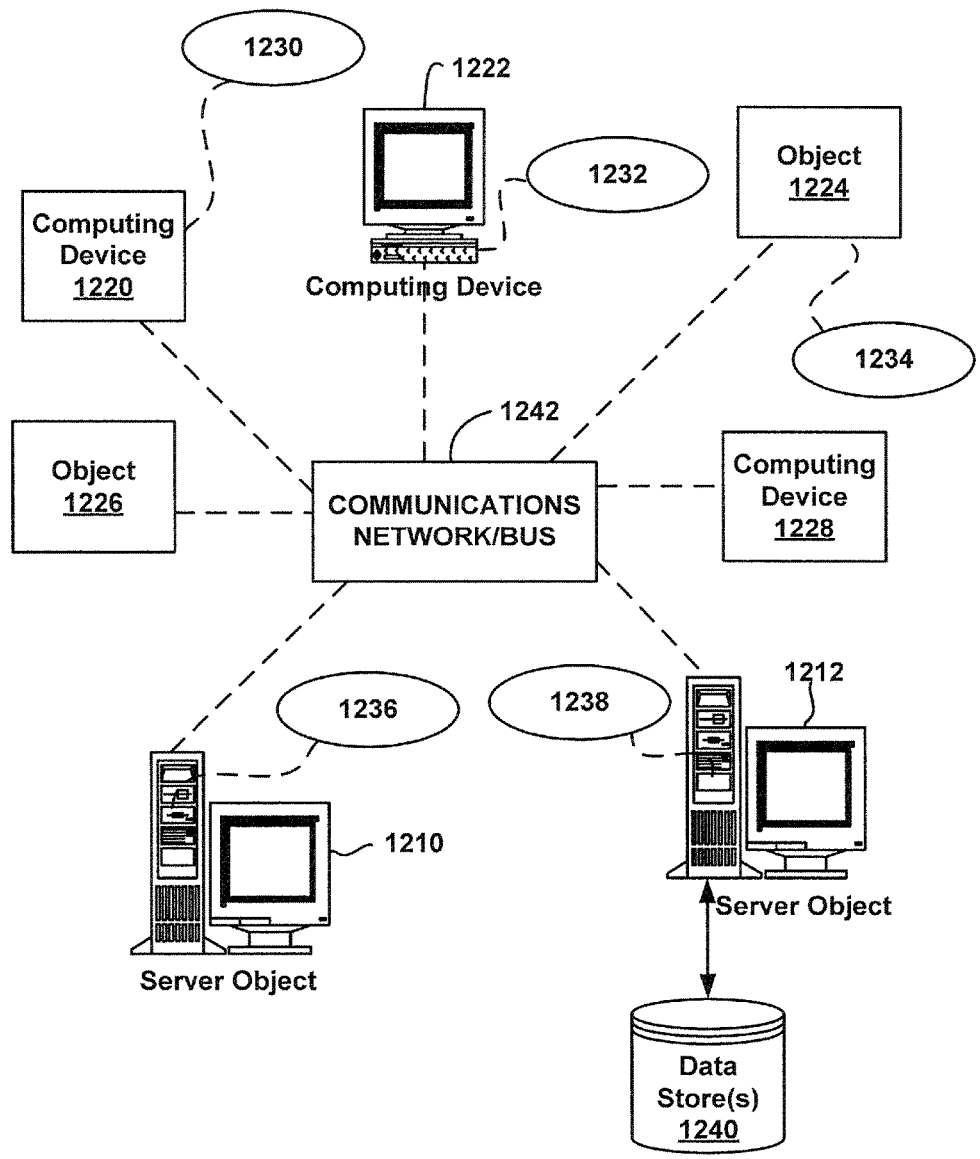
FIG. 12 illustrates a block diagram of an example data communication network that can be operable in conjunction with various aspects described herein.

FIG. 12 provides a schematic diagram of an exemplary networked or distributed computing environment. The distributed computing environment comprises computing objects 1210, 1212, etc. and computing objects or devices 1220, 1222, 1224, 1226, 1228, etc., which may include programs, methods, data stores, programmable logic, etc., as represented by applications 1230, 1232, 1234, 1236, 1238 and data store(s) 1240. It can be appreciated that computing objects 1210, 1212, etc. and computing objects or devices 1220, 1222, 1224, 1226, 1228, etc. may comprise different devices, including a multimedia display device or similar devices depicted within the illustrations, or other devices such as a mobile phone, personal digital assistant (PDA), audio/video device, MP3 players, personal computer, laptop, etc. It should be further appreciated that data store(s) 1240 can include memory or other similar data stores as disclosed herein.

Each computing object 1210, 1212, etc. and computing objects or devices 1220, 1222, 1224, 1226, 1228, etc. can communicate with one or more other computing objects 1210, 1212, etc. and computing objects or devices 1220, 1222, 1224, 1226, 1228, etc. by way of the communications network 1242, either directly or indirectly. Even though illustrated as a single element in FIG. 12, communications network 1242 may comprise other computing objects and computing devices that provide services to the system of FIG. 12, and/or may represent multiple interconnected networks, which are not shown. Each computing object 1210, 1212, etc. or computing object or devices 1220, 1222, 1224, 1226, 1228, etc. can also contain an application, such as applications 1230, 1232, 1234, 1236, 1238, that might make use of an API, or other object, software, firmware and/or hardware, suitable for communication with or implementation of the techniques and disclosure described herein.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 12, as a non-limiting example, computing objects or devices 1220, 1222, 1224, 1226, 1228, etc. can be thought of as clients and computing objects 1210, 1212, etc. can be thought of as servers where computing objects 1210, 1212, etc., acting as servers provide data services, such as receiving data from client computing objects or devices 1220, 1222, 1224, 1226, 1228, etc., storing of data, processing of data, transmitting data to client computing objects or devices 1220, 1222, 1224, 1226, 1228, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 1242 or bus is the Internet, for example, the computing objects 1210, 1212, etc. can be Web servers with which other computing objects or devices 1220, 1222, 1224, 1226, 1228, etc. communicate via any of a number of known protocols, such as the hypertext transfer protocol (HTTP). Computing objects 1210, 1212, etc. acting as servers may also serve as clients, e.g., computing objects or devices 1220, 1222, 1224, 1226, 1228, etc., as may be characteristic of a distributed computing environment.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system for controlling frequency of a clock buffer in association with a voltage droop, comprising:
    a microprocessor that is configured to receive a clock provided by the clock buffer;
    a voltage detector comprising a low-pass filter, the voltage detector being configured to detect a relative voltage droop based on a comparison of (a) a voltage associated with the microprocessor with (b) a low-pass filtered version of the voltage associated with the microprocessor; and
    a controller configured for controlling the frequency of the clock provided by the clock buffer based on the comparison of (a) the voltage associated with the microprocessor with (b) the low-pass filtered version of the voltage associated with the microprocessor, the controller being further configured for reducing the frequency of the clock in response to a defined criterion associated with the voltage being satisfied, and incrementally increasing the frequency of the clock in response to another defined criterion associated with the voltage being satisfied.

2. The system of claim 1, wherein the controller is configured for controlling modification of an input signal received by the clock buffer.

3. The system of claim 1, wherein the controller is configured for reducing the frequency of the clock in response to a determination that the voltage is below a defined threshold, and incrementally increasing the frequency of the clock in response to another determination that the voltage is equal to or above the defined threshold after being below the defined threshold.

4. The system of claim 3, wherein, in response to the other determination that the voltage is equal to or above the defined threshold after being below the defined threshold, the controller is configured for incrementally increasing the frequency of the clock until the frequency reaches a defined frequency level.

5. The system of claim 4, wherein the defined frequency level corresponds to the frequency of the clock before being reduced.

6. The system of claim 3, wherein the controller is configured for repeating the incrementally increasing of the frequency of the clock, until an original frequency of the clock is reached, in response to the voltage being equal to or above the defined threshold after being below the defined threshold.

7. The system of claim 1, wherein, in response to a determination that the voltage is below a defined threshold, the controller is configured for reducing the frequency of the clock to a first frequency that is less than the frequency of the clock, and
    wherein, in response to another determination that the voltage is equal to or above the defined threshold after being below the defined threshold, the controller is configured for increasing the first frequency of the clock to a second frequency that is greater than the first frequency, and increasing the second frequency of the clock to a third frequency that is greater than the second frequency after a defined period of time.

8. The system of claim 1, wherein the controller is configured for reducing the frequency of the clock by dividing the frequency of the clock.

9. The system of claim 1, wherein the controller is configured for incrementally increasing the frequency of the clock based on a timer.

10. The system of claim 1, wherein the voltage is a supply voltage received by the microprocessor.

11. A method for improving tolerance to voltage supply noise, comprising:
    monitoring a voltage associated with a microprocessor;
    detecting a relative voltage droop event based on comparing the voltage associated with the microprocessor with a low-pass filtered version of the voltage associated with the microprocessor;
    reducing a frequency of a clock provided to the microprocessor in response to detecting the relative voltage droop event; and
    incrementally increasing the frequency of the clock in response to another determination that the voltage droop event has ended.

12. The method of claim 11, wherein the incrementally increasing the frequency of the clock comprises incrementally increasing the frequency of the clock until the frequency reaches a defined frequency level.

13. The method of claim 11, wherein the incrementally increasing the frequency of the clock comprises incrementally increasing the frequency of the clock until an original frequency of the clock is reached.

14. The method of claim 11, wherein the reducing the frequency of the clock comprises reducing the frequency of the clock to a first frequency that is less than the frequency of the clock, and
    wherein the increasing the frequency of the clock comprises increasing the first frequency of the clock to a second frequency that is greater than the first frequency, and increasing the second frequency of the clock to a third frequency that is greater than the second frequency after a defined period of time.

15. The method of claim 11, wherein the reducing the frequency of the clock comprises dividing the frequency of the clock.

* * * * *